United States Patent [19]
Fujita

[11] Patent Number: 5,768,212
[45] Date of Patent: Jun. 16, 1998

[54] SEMICONDUCTOR MEMORY

[75] Inventor: Mamoru Fujita, Tokyo, Japan

[73] Assignee: NEC Corporation, Japan

[21] Appl. No.: 688,440

[22] Filed: Jul. 30, 1996

[30]    Foreign Application Priority Data

Aug. 11, 1995  [JP]  Japan ................... 7-206094

[51] Int. Cl.$^6$ ............................................. G11C 8/00
[52] U.S. Cl. ..................... 365/230.08; 365/189.05; 365/233
[58] Field of Search ..................... 365/189.05, 219, 365/233, 230.08

[56]    References Cited

U.S. PATENT DOCUMENTS 4,775,990  10/1988  Kamuro et al. ............ 365/219 X
5,610,864   3/1997  Manning .................... 365/233 X

OTHER PUBLICATIONS

H.-J. Yoo, et al., "A 150MHz 8-Banks 256M Synchronous DRAM with Wave Pipelining Methods", 1995 IEEE International Solid-State Circuits Conference, ISSCC95, Session 14, DRAM, Paper FA 14.4, pp. 250-251.

*Primary Examiner*—Joseph A. Popek

[57]    ABSTRACT

In the semiconductor memory of this invention, a first unit of data that is inputted by means of the same standard clock as an external address and that is inputted to a chip prior to determination of the internal address signal that is prefetched is latched to all latch circuits into which this data may be latched. After an address is determined by the next standard clock, second and succeeding units of data inputted to the chip are inputted only to latch circuits that are latched in accordance with address signals. In this way, even if internal address signal processing has not been completed at the time of latching the first unit of data, both the first unit of data and second and succeeding units of data can be latched in prefetch circuits designated by addresses from the outside.

4 Claims, 4 Drawing Sheets

SEMICONDUCTOR MEMORY

BACKGROUND OF THE INVENTION

1. Field of the Invention

The present invention relates to a semiconductor memory, and particularly to a high-speed memory write method having a burst mode.

2. Description of the Related Art

In recent years, the disparity in speed between the CPU and DRAM used in the main memory has raised problems in that the limited improvements in speed of DRAM have been outpaced by dramatic improvement in CPU speed, rendering DRAM incapable of meeting demands of the CPU. In computer systems employing high-speed CPUs, a small proportion of high-speed cache memory compared to the main memory is therefore provided within the CPU chip or connected to the chip from the outside to make up for speed differences.

Cache memory contains a copy of a portion of the data within the main memory. This copy of data takes as units a plurality of data units of consecutive addresses, these units being referred to as pages. The CPU normally accesses the cache memory. When desired data are not present within the cache memory, the desired data are newly copied from the main memory to the cache memory, this copying being carried out in page units.

As a result, the main memory in this type of system must be capable of inputting and outputting data strings of consecutive addresses to the cache memory at high speed. Methods exist for this purpose in which, by merely designating the starting address, the data string including this address is inputted or outputted synchronous to a clock signal. Such a method is referred to as burst input/output, and the length of a data string which is inputted or outputted through designation of one address is known as the burst length. Synchronous DRAM is one typical example of memory that performs burst input/output.

Normally, the address access time for universal DRAM (DRAM having first page mode is on the order of 20 ns (50 MHz). The time taken in processing one unit of data for synchronous DRAM is basically the same as for universal DRAM, but the apparent processing time for one unit of data can be reduced by multiplexing internal processing and processing a plurality of data units simultaneously, thereby accelerating input/output and obtaining a speed of 100 MHz. As methods for multiplexing internal processing, there exist the pipeline and prefetch methods.

The pipeline method divides internal processing into a number of stages, and sequentially processes information relating to one unit of data through each stage. In other words, a first unit of data processed in the first stage is processed at the second stage in the next clock cycle, while simultaneously, the second unit of data is being processed in the first stage. Because processing in each stage is carried out in parallel and simultaneously, the data of several stages is parallel processed.

In such a method, the degree of parallelism can be raised and the speed of burst input/output can be increased by increasing the number of stages and shortening the process of each stage. However, the number of points of division between stages is limited by the processing relations within the DRAM. In addition, the minimum clock period must agree with the stage taking the longest amount of time. Furthermore, due to increases in overhead in circuits connecting the stages, the number of stages is actually limited to 3 or 4. In other words, the degree of data multiplexing is limited to 3 or 4.

In the prefetch method, all internal processing is carried out in parallel and parallel-serial conversion is performed at the input/output section. In order to raise the degree of multiplexing in this method, the number of units of data that are parallel processed is increased. This method therefore necessitates a number of identical circuits in proportion to the degree of parallelism, thereby increasing the circuit scale and increasing the chip surface area necessary to realize the circuits. In addition, in this method the input/output of data must be performed in units of the degree of parallelism, and data in units below the degree of parallelism cannot be inputted or outputted. As a result, raising the parallelism decreases the degree of functional freedom. For these reasons, the degree of parallelism, or the degree of multiplexing, is limited to 2.

Although higher speeds can be realized by raising the degree of data multiplexing by either of the two methods described above, the degree of multiplexing is limited for various reasons. However, a combination of the above-described two methods can be considered as a means of further multiplexing internal processing and accelerating input/output. This is essentially a method by which the prefetch method is employed in a portion or all of the stages of the pipeline method, and is known as the combined pipeline/prefetch method (hereinafter, the "combined method").

During reading, internal processing of memory is carried in the order of (1) latching and processing of external signals (command, address), (2) reading of data from cell arrays, (3) output of data to the outside. During writing, processing proceeds in the order of (1) latching and processing of external signals (commands, address, data), and (2) writing of data to a cell array.

Here, data output to the outside during reading, as well as latching of data during writing, involves exchange of signals with the outside and therefore precludes multiplexing at prefetching. In contrast, input/output to a cell array can be multiplexed through prefetching by multiplexing input/output paths. As for processing and latching of commands, a prefetch portion of a plurality of data units is inputted/outputted for one command, and the processing system, even a single system, can therefore perform processing for a plurality of data units. Similarly, for latching and processing of addresses, an internal address can be determined for a prefetch portion of a plurality of data units for one external address.

Thus, because the presence or absence of prefetch differs for each process, stages are delimited at these processing times in a combined method. Here, each process may be composed of a plurality of stages.

Regarding an example of such a combined method of the prior art, FIG. 1 is a circuit diagram showing a prior art example, and FIG. 2 is a timing chart illustrating the operation of the prior-art example.

The prior-art example of FIG. 1 includes a first stage from address input in which internal processing of addresses is performed and a second stage in which data input/output is performed for cells indicated by internally processed addresses. In reading, more stages are actually required for processing from this point on to data output, but these stages are here omitted because they bear no relation to this portion of the invention.

In the second stage, a 2-bit prefetch operation is performed. Two simultaneously operating write amplifiers 9 and 10 and respectively connected data latch circuits 5 and 6 are provided for this purpose. Input to data latch circuits 5 and 6 is performed according to latch signals LP0 and LP1, respectively, which are outputted from latch pulse generation circuit 4'. Although the present example of the prior art employs a 2-bit prefetch operation, parallel operation of more bits is also possible.

When writing, write command signal CMD and, from the external address terminal, the address to be written first (external address signal) EA0 by burst operation, are inputted at time T0 according to standard clock signal CLK. External addresses are inputted only at the time of command input.

Address buffer circuit 1 latches external address signal EA0, and based on this, internal address generation circuit 2 generates internal address signal IA0 from external address signal EA0 to bring about burst operation. A time interval of several ns is required to generate internal address signal IA0. Data ED0 to be written first is inputted to data-in buffer circuit 3 at the same time as external address input. This data ED0 is the starting data of the burst and is inputted to data latch circuit 5 or 6. The data latch circuit to which the data are inputted determines which write amplifier, 9 or 10, the data are written to, and which memory cell the data are written to. Accordingly, address signal IA0 is necessary for judging which latch signal, LP0 or LP1, to activate in order to store data to data latch circuits 5 and 6.

As described hereinabove, internal address signal IA0 is not generated for a certain amount of time (several ns), and accordingly, data storage is delayed until the end of this time period.

After waiting for the generation of internal address signal IA0, data ED0 is stored in data latch circuit 5.

At the next standard clock signal, the second unit of data ED1 of the burst is inputted from the outside. Data ED1 undergoes the same processing as data ED0 and is stored in data latch circuit 6. The output of data latch circuits 5 and 6 pass through data bus 7 and 8, respectively, are formed into pairs by write amplifiers 9 and 10, and are written to memory array 11.

In the prefetch method, as in the combined method, a plurality of data units serially inputted from outside a chip are parallel processed within the chip, and parallel-serial conversion of data is performed to serially output to the chip exterior data that have been parallel processed within the chip.

The external address signal and first unit of data are normally inputted from the exterior at the same time. In addition, the correspondence between a unit of data in a sequence and data within parallel-processed data is determined by an address signal inputted at the same time as the first unit of data.

Accordingly, in the prior art example, parallel-serial conversion cannot be effected until address signals inputted from the outside are internally processed.

When reading, parallel-serial conversion is effected after accessing the cell array. In order to access a cell array, internal processing of the address signal must first be completed. Because internal processing of address signals is already completed at the time of parallel-serial conversion, no problem is encountered.

However, all data that are accessed when accessing a cell array must be prefetched when writing, and serial-parallel conversion must therefore be completed beforehand. The converted data are serially inputted, and consequently, the conversion of previously inputted data must be effected before the final data in order for conversion of final data to be in time for cell array access. When writing, therefore, address internal processing must be carried out before cell array access in order to effect serial-parallel conversion.

Conversely, if internal processing of addresses takes longer than the time from input of data until the time of latching, the latching of data must be delayed, and the writing speed is therefore slowed.

SUMMARY OF THE INVENTION

The object of the present invention is to provide a semiconductor memory having a high-speed burst mode.

A semiconductor memory according to the present invention has a burst input function, and in internal data processing, has a plurality of data latch circuits into which data serially inputted from the outside are stored, thereby effecting serial-to-parallel conversion.

In addition, according to a write method of a semiconductor memory of the present invention, the first unit of data of burst input is stored to all circuits among a plurality of data latch circuits into which it may be stored regardless of address signals inputted from the outside, and each succeeding unit of data is stored to one among the plurality of data latch circuits according to address signals inputted from the outside.

According to the semiconductor memory of the present invention, a first unit of data that is inputted according to the same standard clock as an external address and that is inputted to the chip before determination of a prefetched internal address signal is latched in all latch circuits into which this unit of data may be latched. After determination of an address by the next standard clock, the second and succeeding units of data inputted to the chip are inputted only to latch circuits that are caused to latch by address signals.

In this way, even if internal address signal processing is not completed at the time of latching the first unit of data, both the first unit of data and second and succeeding units of data are latched in prefetch circuits designated by addresses from the outside.

The above and other objects, features, and advantages of the present invention will become apparent from the following description with references to the accompanying drawings which illustrate examples of the present invention.

DETAILED DESCRIPTION OF THE PREFERRED EMBODIMENTS

Figure 1:
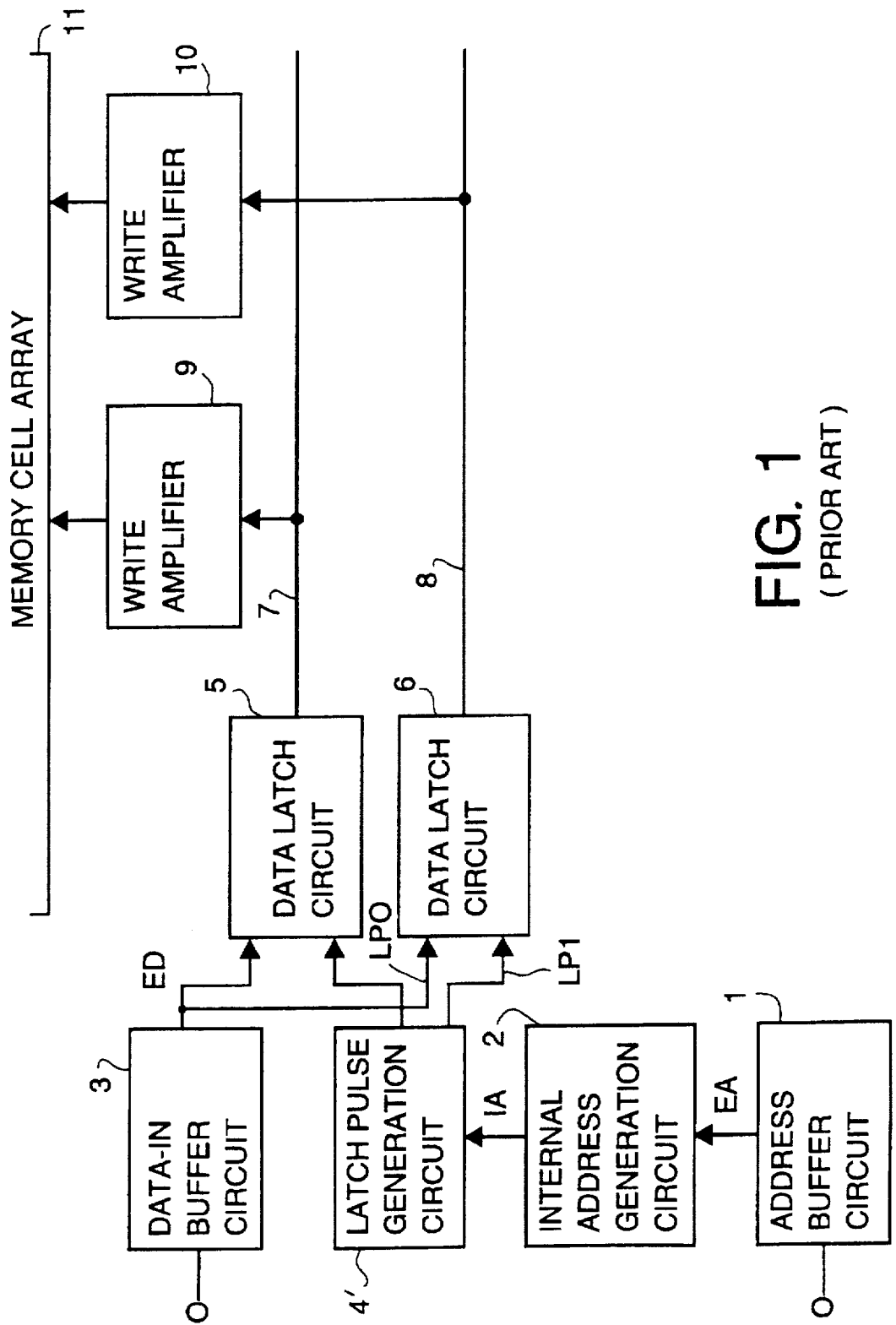
FIG. 1 is a circuit diagram showing an example of a semiconductor memory of the prior art.
Figure 2:
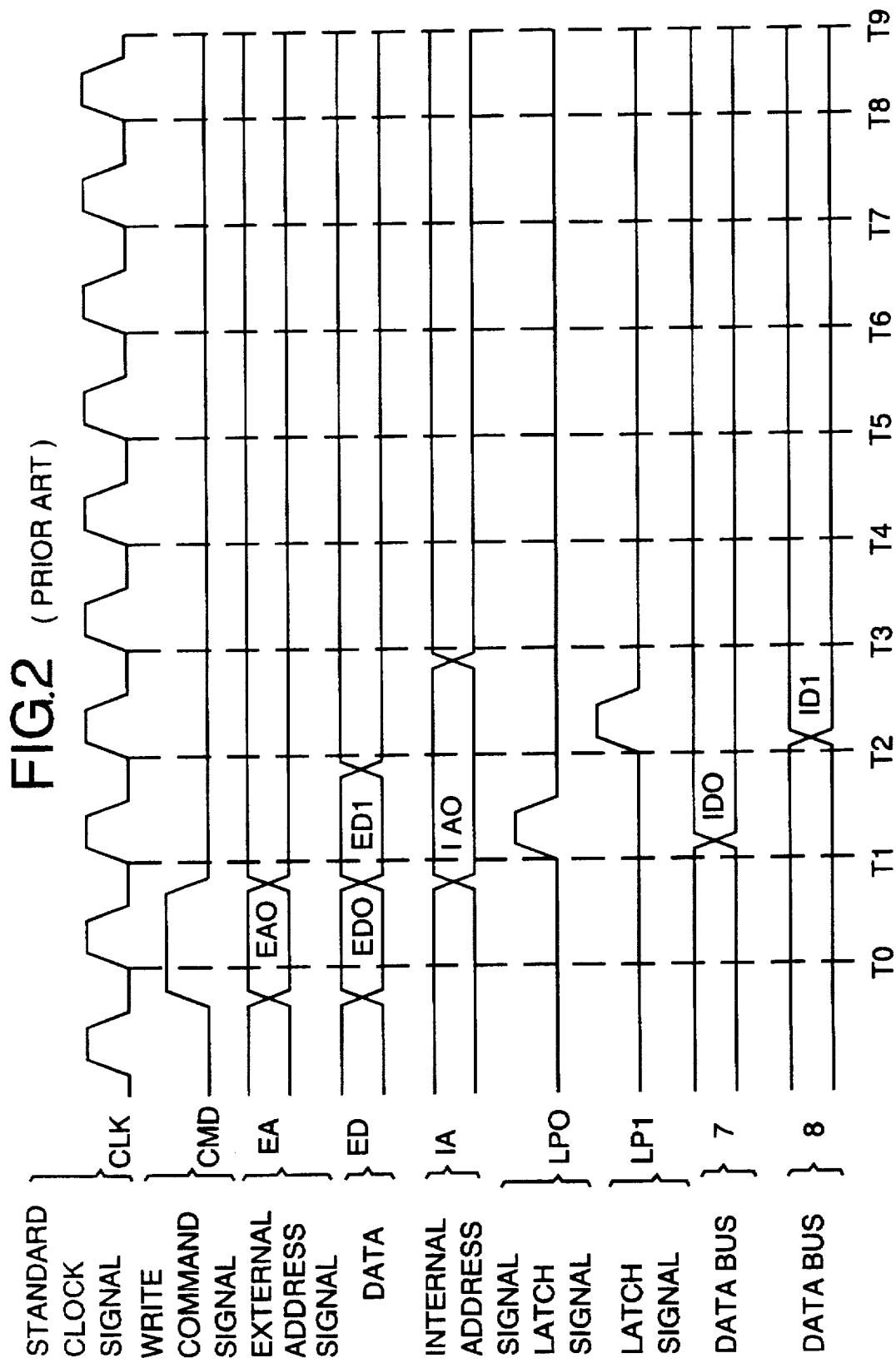
FIG. 2 is a timing chart for the prior-art example of FIG. 1.
Figure 3:
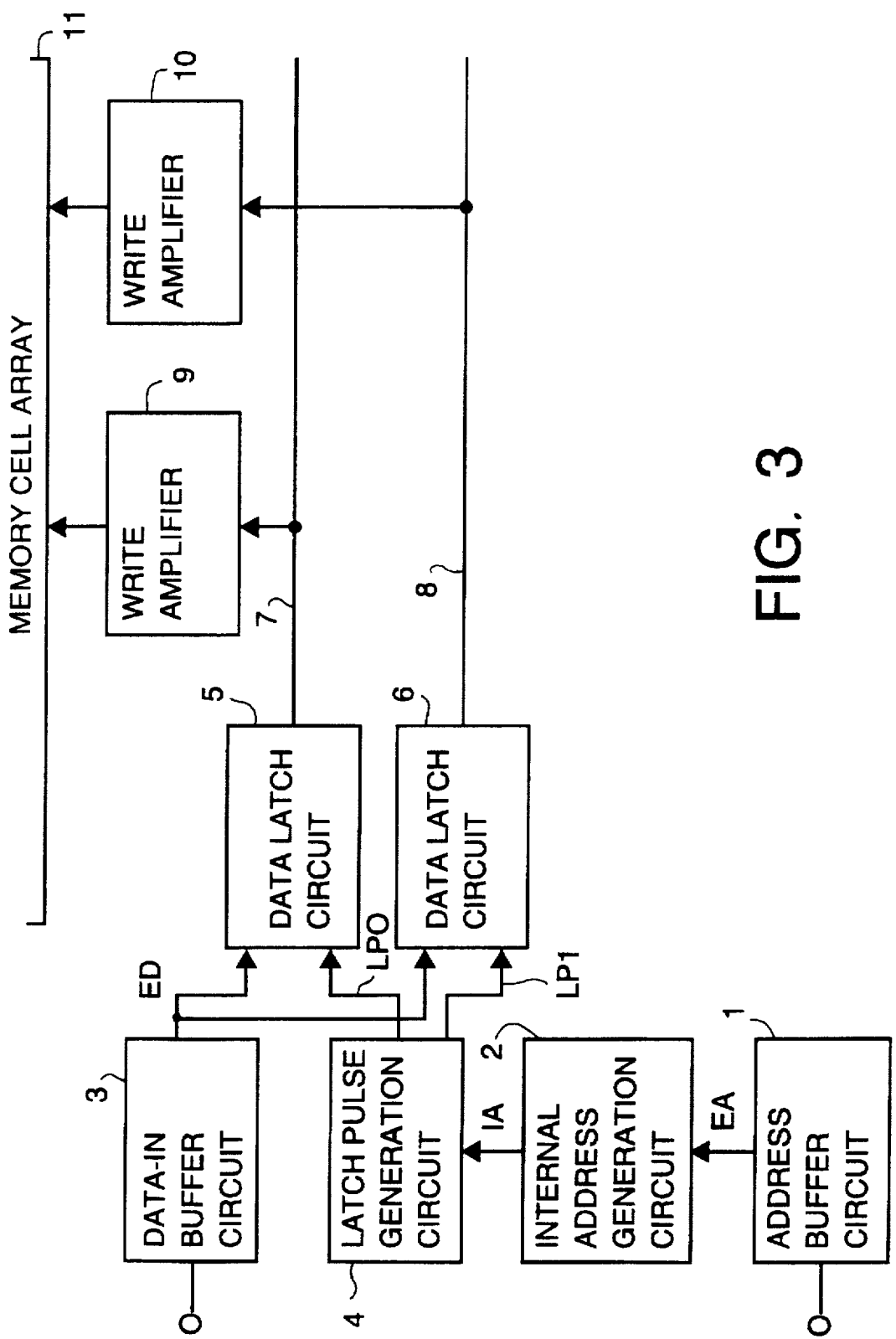
FIG. 3 is a circuit diagram showing a semiconductor memory according to an embodiment of the present invention.

As in the prior-art example shown in FIG. 1, the present embodiment includes a first stage from address input in which internal processing of addresses is performed, and a second stage in which input/output is performed with respect to cells designated by the internally processed addresses. When reading, a subsequent third stage is actually required for performing processing up to data output, but this stage not related to the present invention and is therefore here omitted. Further, while the minimum necessary pipeline configuration is shown in the present embodiment, a more fractionalized pipeline configuration may also be employed.

The second stage performs a 2-bit prefetch operation. Two simultaneously operating write amplifiers 9 and 10 and respectively connected data latch circuits 5 and 6 are provided for this purpose. Input to data latch circuits 5 and 6 is effected by latch signals LP0 and LP1, respectively, which are outputted from latch pulse generation circuit 4. While the present embodiment employs a 2-bit prefetch operation, a parallel operation involving more bits is also possible.

Figure 4:
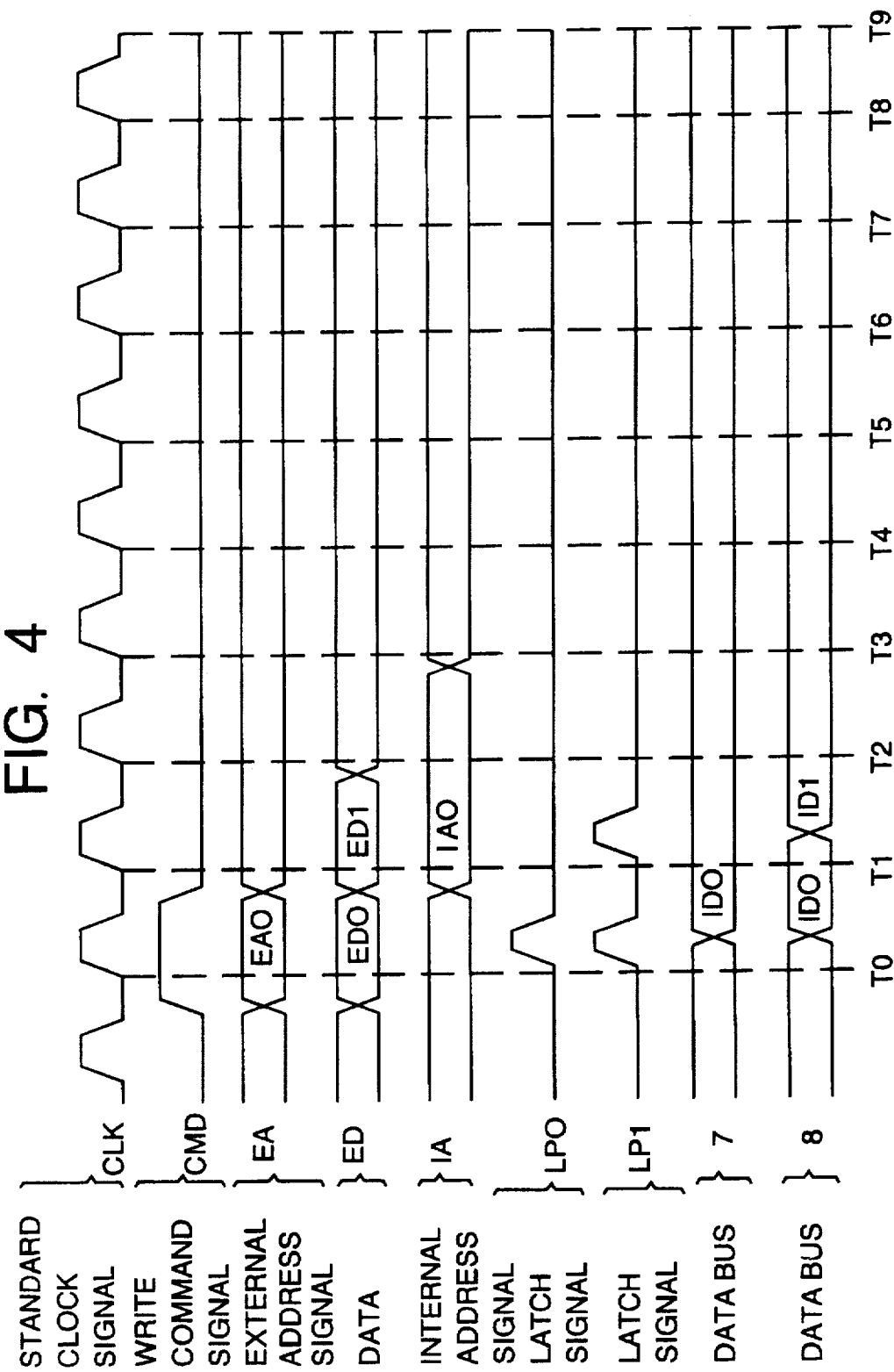
FIG. 4 is a timing chart for the semiconductor memory shown in FIG. 3.

The operation of the present embodiment will next be explained with reference to the timing chart of FIG. 4.

When writing, write command signal CMD and the first address (external address signal) to be written in a burst operation are inputted at time T0 in accordance with standard clock signal CLK.

External address EA is inputted only at the time of command input.

Address buffer circuit 1 latches external address signal EA0, and based on this signal, internal address generation circuit 2 generates internal address signal IA0 from external address signal EA0 to effect the burst operation. The generation of IA0 requires a certain amount of time (several ns).

Simultaneous with the input of the external address, data ED0 to be written first is inputted to data-in buffer circuit 3. This unit of data is the start data of the burst. These data are inputted to both data latch circuits 5 and 6 in accordance with latch signals LP0 and LP1. Accordingly, the content of both data latch circuits 5 and 6 is identical at this time. Because this operation is performed regardless of address signals, the previously mentioned generation of internal address signal IA0 from external address EA0 need not be performed.

The second unit of data ED1 of the burst is inputted from outside at the next standard clock signal CLK. Data ED1 is paired with data ED0 and written to the cell array. By this time point, generation of internal address signal IA0 has been completed, and the data latch circuit that is to latch data ED1 can therefore be determined. Here, an example is shown in which data ED1 is latched in data latch circuit 5 in accordance with latch signal LP1. Accordingly, with data ED0 still latched in data latch circuit 6, two units of data ED0 and ED1 are at this time latched in the respectively appropriate data latch circuit 5 and 6 in accordance with external address signal EA0, this output passes through data bus 7 and 8, and the respective units of data are correctly written to the desired memory cells through the operation of write amplifiers 9 and 10. This method thus provides a solution to the problem in the prior art in which processing of data ED0 cannot be effected by the time internal address IA0 is determined.

While a preferred embodiment of the present invention has been described using specific terms, such description is for illustrative purposes only, and it is to be understood that changes and variations may be made without departing from the spirit or scope of the invention.

What is claimed is:

1. A write method for a semiconductor memory having an internal address generating circuit, a data buffer, a latch pulse generating circuit, a first data latch circuit, and a second data latch circuit, comprising:

said internal address generating circuit generating an internal address signal in response to an external address signal, said data buffer receiving at least first and second data, said latch pulse generating circuit generating first and second pulse signals, controlling said first data latch circuit in response to said first pulse signal, and controlling said second data latch circuit in response to said second pulse signal, said latch pulse generating circuit generating said first and second pulse signals in response to said external address signal, said first and second data latch circuits latching said first data from said data buffer in response to said first and second pulse signals respectively, said latch pulse generating circuit continuously generating said first pulse signal in response to said internal address signal, and said first data latch circuit latching said second data from said data buffer in response to said first pulse signal.

2. A semiconductor memory comprising:

an internal address generating circuit generating an internal address signal in response to an external address signal;

a data buffer receiving at least first and second data;

a latch pulse generating circuit generating first and second pulse signals;

a first data latch circuit controlled by said first pulse signal; and a second data latch circuit controlled by said second pulse signal;

said latch pulse generating circuit generating said first and second pulse signals in response to said external address signal, said first and second data latch circuits latch said first data from said data buffer in response to said first and second pulse signals, respectively, said latch pulse generating circuit continuously generating said first pulse signal in response to said internal address signal, and said first data latch circuit latching said second data from said data buffer in response to said first pulse signal.

3. A write method for a semiconductor memory having an internal address generating circuit, a data buffer, first and second data latch circuits, and a latch pulse generating circuit, comprising:

said internal address generating circuit generating an internal address signal receiving at least first and second data, said latch pulse generating circuit generating a first pulse signal in response to said external address signal, said first and second data latch circuits latching said first data from said data buffer in response to said first pulse signal, said latch pulse generating circuit continuously generating a second pulse signal selecting said first data latch circuit in response to said internal address signal, and said first data latch circuit latching said second data from said data buffer in response to said second pulse signal.

4. A semiconductor memory comprising:

an internal address generating circuit generating an internal address signal in response to an external address signal;

a data buffer receiving at least first and second data;

a latch pulse generating circuit generating a first pulse signal in response to said external address signal; and first and second data latch circuits latching said first data from said data buffer in response to said first pulse signal;

said latch pulse generating circuit continuously generating a second pulse signal selecting said first data latch circuit in response to said internal address signal, and said first data latch circuit latching said second data from said data buffer in response to said second pulse signal.

* * * * *